(12) United States Patent
Chu et al.

(10) Patent No.: US 10,651,413 B2
(45) Date of Patent: May 12, 2020

(54) LIGHT-EMITTING DEVICE AND DISPLAY PANEL INCLUDING THE SAME

(71) Applicant: INT TECH CO., LTD., Hsinchu County (TW)

(72) Inventors: Ker Tai Chu, Taipei (TW); Kuo-Cheng Hsu, Taichung (TW)

(73) Assignee: INT TECH CO., LTD., Hsinchu (TW)

( * ) Notice: Subject to any disclaimer, the term of this patent is extended or adjusted under 35 U.S.C. 154(b) by 0 days.

(21) Appl. No.: 15/692,304

(22) Filed: Aug. 31, 2017

(65) Prior Publication Data

US 2018/0309082 A1 Oct. 25, 2018

Related U.S. Application Data

(60) Provisional application No. 62/487,097, filed on Apr. 19, 2017.

(51) Int. Cl.
*G09G 3/32* (2016.01)
*H01L 51/52* (2006.01)
(Continued)

(52) U.S. Cl.
CPC .......... *H01L 51/5203* (2013.01); *G06F 3/044* (2013.01); *G06F 3/0412* (2013.01);
(Continued)

(58) Field of Classification Search
None
See application file for complete search history.

(56) References Cited

U.S. PATENT DOCUMENTS

| 5,451,977 A | 9/1995 | Kusuda et al. |
| 2006/0279499 A1* | 12/2006 | Park ..................... G09G 3/3225 345/92 |

(Continued)

FOREIGN PATENT DOCUMENTS

| CN | 102593149 A | 7/2012 |
| CN | 104201190 A | 12/2014 |

(Continued)

OTHER PUBLICATIONS

Office Action and Search Report dated Sep. 18, 2018 issued by Taiwan Intellectual Property Office for counterpart application 106142604.

(Continued)

*Primary Examiner* — Carl Adams
(74) *Attorney, Agent, or Firm* — WPAT, P.C., Intellectual Property Attorneys; Anthony King

(57) ABSTRACT

A light-emitting device includes an organic light-emitting layer, a first electrode disposed at one side of the organic light-emitting layer, and a second electrode disposed at the same side of the organic light-emitting layer as the first electrode. The first electrode is spaced apart from the second electrode. A display panel includes a substrate including a display region and a touch sensing region defined along a substrate-horizontal direction, at least one light-emitting device disposed over the substrate in the display region, and at least one touch sensor disposed over the substrate in the touch sensing region. The display region and the touch sensing region are not overlapped.

20 Claims, 7 Drawing Sheets

(51) Int. Cl.
*H01L 51/56* (2006.01)
*G06F 3/041* (2006.01)
*H01L 27/32* (2006.01)
*G06F 3/044* (2006.01)

(52) U.S. Cl.
CPC ........ *H01L 27/323* (2013.01); *H01L 27/3227* (2013.01); *H01L 27/3262* (2013.01); *H01L 51/5225* (2013.01); *H01L 51/56* (2013.01); *H01L 27/3211* (2013.01)

(56) References Cited

U.S. PATENT DOCUMENTS

| | | | |
|---|---|---|---|
| 2008/0158107 A1* | 7/2008 | Miller | G09G 3/22 345/76 |
| 2009/0008665 A1 | 1/2009 | Lee et al. | |
| 2009/0257231 A1* | 10/2009 | Fujikawa | F16M 11/10 362/311.01 |
| 2012/0249454 A1 | 10/2012 | Teraguchi et al. | |
| 2014/0340348 A1* | 11/2014 | Park | G06F 3/044 345/174 |
| 2014/0367633 A1 | 12/2014 | Bibl et al. | |
| 2015/0129848 A1* | 5/2015 | Yeh | G06F 3/0412 257/40 |
| 2015/0262530 A1* | 9/2015 | Sato | G09G 3/3233 345/83 |
| 2015/0371585 A1* | 12/2015 | Bower | H01L 25/0753 345/1.1 |
| 2017/0108979 A1* | 4/2017 | Lu | G06F 3/041 |

FOREIGN PATENT DOCUMENTS

| | | |
|---|---|---|
| TW | 200718272 A | 5/2007 |
| TW | 200904234 | 1/2009 |

OTHER PUBLICATIONS

English Abstract Translation of Office Action and Search Report issued by Taiwan Intellectual Property Office for counterpart application 106142604.
Office Action and Search Report dated Mar. 5, 2019 issued by Taiwan Intellectual Property Office for counterpart application 106142604.
English Abstract for Foreign Document TW 200718272 and Taiwan Office Action.
Office Action and Search Report dated Mar. 16, 2020 issued by China National Intellectual Property Association for counterpart application No. 201710778468.7.
Search Report issued by China National Intellectual Property Association for counterpart application No. 201710778468.7.
English Abstract Translation for Foreign Reference CN 104201190 A.

* cited by examiner

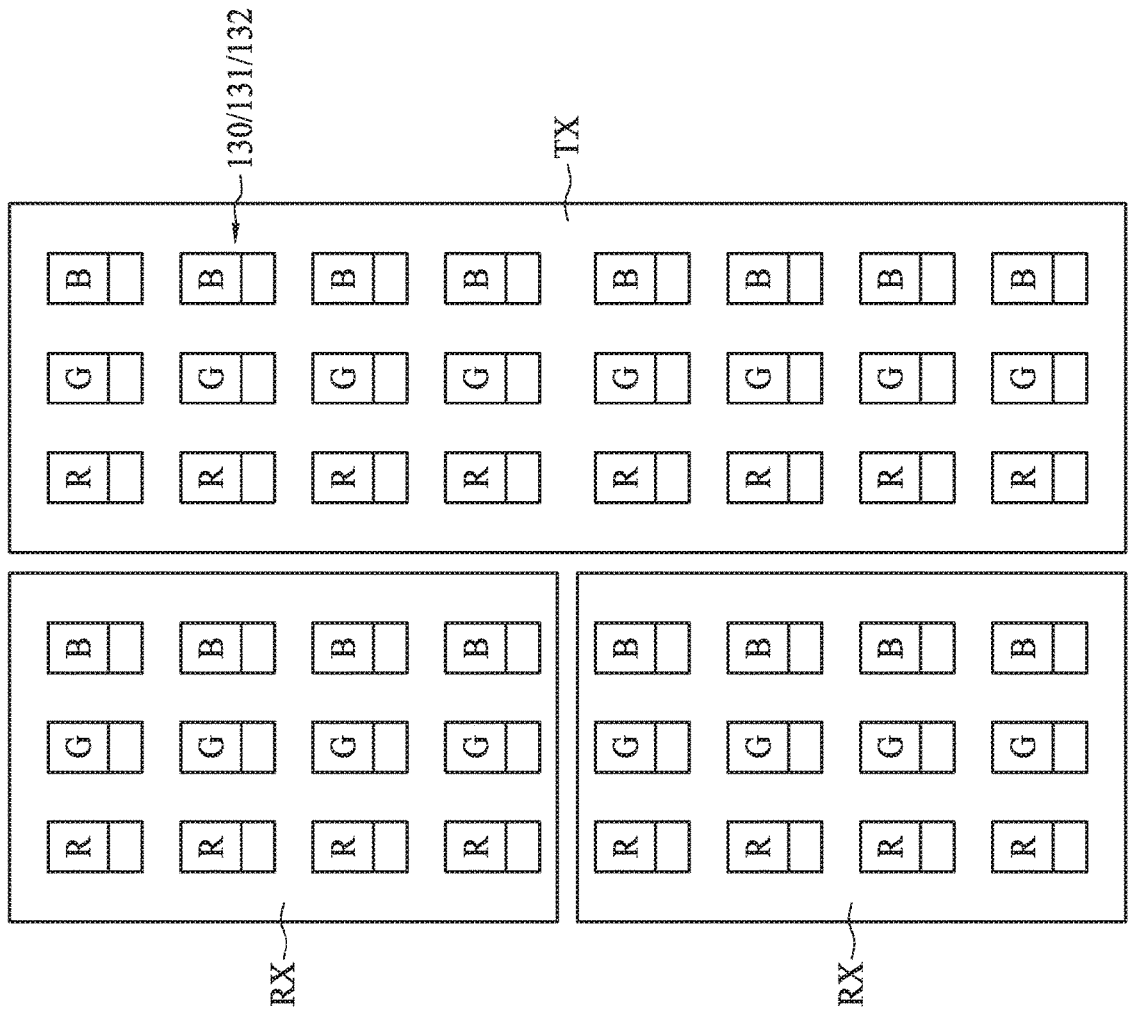

LIGHT-EMITTING DEVICE AND DISPLAY PANEL INCLUDING THE SAME

CROSS-REFERENCE TO RELATED APPLICATIONS

The present application claims priority of U.S. Provisional Patent Application Ser. No. 62/487,097, filed on Apr. 19, 2017, which is incorporated herein by reference in its entirety.

TECHNICAL FIELD

The present disclosure is related to a light-emitting device and a display panel including the same, especially to an organic light-emitting device and a touch display panel including the same.

BACKGROUND

In current information era, human beings by degrees tend to rely on electronic products. The electronic products such as mobile phones, handheld personal computers (PCs), personal digital assistants (PDAs) and smart phones have pervaded everywhere in our daily life. To meet current demands on portable, compact, and user-friendly information technology (IT) products, touch panels have been introduced as input devices in replacement of conventional keyboards or mice.

A touch panel (or a touch screen) is widely used in electronic devices to detect an input action or an event by a user. Typically, the touch panel may detect the presence and location of a touch of the user by generating an electrical signal when the touch panel is touched by a finger, a stylus pen, or the like. The touch panel is usually mounted on a display panel, e.g., an organic light-emitting diode (OLED) display panel, a liquid crystal display (LCD) panel, etc., or may be formed within the display panel. The touch panel may be classified into, e.g., a resistive touch panel, a capacitive touch panel, an electromagnetic touch panel, an infrared touch panel, a surface acoustic wave (SAW) touch panel, a near field imaging (NFI) touch panel, etc. Among the touch panels, a touch display panel capable of performing both a touch function and a display function is one of the most popular products at present.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a plan view of a touch display panel according to aspects of the present disclosure in some embodiments.

DETAILED DESCRIPTION

Figures 1, 2:
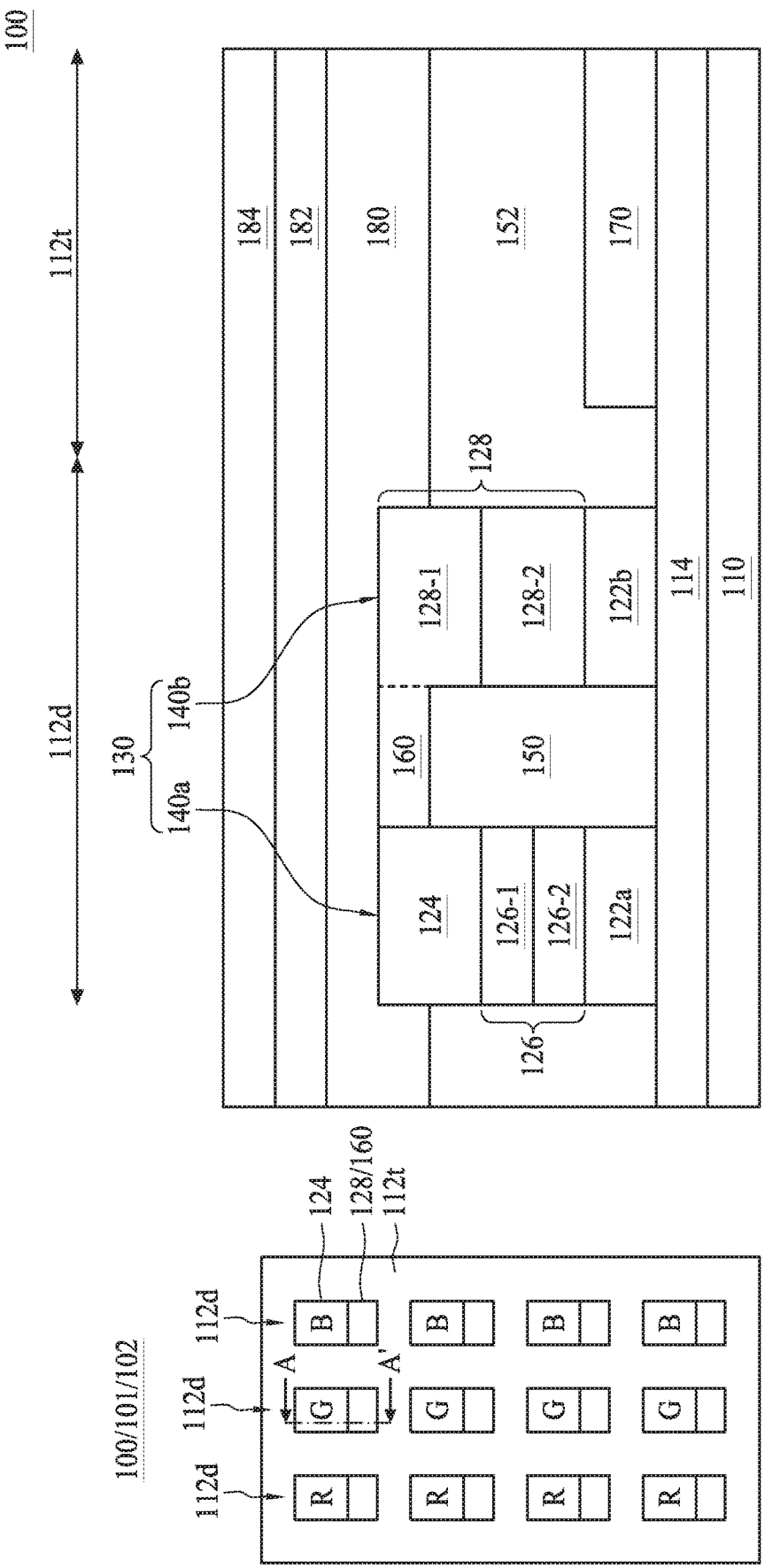
FIG. 1 is a plan view of a touch display panel according to aspects of the present disclosure in some embodiments.
FIG. 2 is a schematic drawing illustrating a light-emitting device and a portion of the touch display panel according to aspects of the present disclosure in some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

FIG. 1 is a plan view of a touch display panel according to aspects of the present disclosure in some embodiments, FIG. 2 is a schematic drawing illustrating a light-emitting device and a portion of the touch display panel according to aspects of the present disclosure in some embodiments. Additionally, the light-emitting device shown in FIG. 2 can be a cross-sectional view taken along line A-A' of FIG. 1 in some embodiments. Referring to FIG. 1, a display panel is provided. In some embodiments, the display panel can be a touch display panel 100. The touch display panel 100 includes a substrate 110. In some embodiments of the present disclosure, the substrate 110 can include one of the following materials: polyethylene naphthalate (PEN), polyethylene terephthalate (PET), polycarbonate (PC), and polyimide (PI), but the disclosure is not limited thereto. In some embodiments, at least one display region 112d and at least one touch sensing region 112t are defined along a substrate-horizontal direction as shown in FIGS. 1 and 2. In other words, the display region 112*d* and the touch sensing region 112*t* are not overlapped. In some embodiments, the touch sensing regions 112*t* surround the display region 112*d* as shown in FIG. 1, but the disclosure is not limited thereto.

The display regions 112*d* are defined to accommodate sub-pixels. It should be noted that the term "sub-pixel" is employed in its art recognized usage to designate a unit that can be stimulated to emit light independently. The sub-pixel is generally used to designate the smallest addressable unit in a display panel that can be independently addressable to emit light of a specific color. Usually, the term "subpixel" is used in multicolor display panels and is employed to designate any portion of a pixel. For example, a blue sub-pixel is that portion of a pixel, which can be addressed to produce blue light. Accordingly, the display region 112*d* is defined to accommodate a first sub-pixel R addressed to produce red light, another display region 112*d* is defined to accommodate a second sub-pixel G addressed to produce a green light, and still another display region 112*d* is defined to accommodate a third sub-pixel B addressed to produce a blue light. In some embodiments, the first sub-pixel R, the second sub-pixel G and the third sub-pixel B are periodically arranged in a row direction, but the disclosure is not limited thereto. In some embodiments, the same sub-pixels R, G, or B are repeatedly arranged in a column direction, but the disclosure is not limited thereto. As shown in FIG. 1, the display regions 112*d* for accommodating the different sub-pixels R, G and B include a same size. However, in some embodiments of the disclosure, the display regions 112*d* for accommodating the different sub-pixels R, G and B can include different sizes.

Still referring to FIG. 1, the touch display panel 100 includes an array layer 114 disposed over the substrate 110. The abovementioned sub-pixels R, G and B are independently controlled by, for example, thin film transistors (TFTs). The TFTs are arranged in an array and thus structure including the TFT array is herein referred to as the array layer 114. In some embodiments, such TFTs can be constructed by using amorphous silicon, low temperature polycrystalline silicon, single crystalline silicon, other inorganic semiconductors, organic semiconductor materials, or the like.

Referring to FIG. 1, the touch display panel 100 includes at least one light-emitting device 130 disposed over the substrate 102 in each of the display regions 112*d*. For example, a light-emitting device 130 emitting red light is disposed in the display regions 112*d* for the red sub-pixels R, a light-emitting device 130 emitting green light is disposed in the display regions 112*d* for the green sub-pixels G, and a light-emitting device 130 emitting blue light is disposed in the display regions 112*d* for the blue sub-pixels B. In some embodiments of the present disclosure, the light-emitting device 130 includes a first electrode 122*a*, a second electrode 122*b*, and a light-emitting layer 124. More importantly, the first electrode 122*a* is disposed at one side of the light-emitting layer 124, and the second electrode 122*a* is disposed at the same side of the light-emitting layer 124 as the first electrode 122*a*. In other words, both of the first electrode 122*a* and the second electrode 122*b* are disposed at the same side of the light-emitting layer 124 as shown in FIG. 2. And the first electrode 122*a* is spaced apart and electrically isolated from the second electrode 122*b*. Methods for preparing such light-emitting device 130 are well known in the art. For example, a conductive layer (not shown) is formed over the substrate 102 and patterned to form the first electrode 122*a* and the second electrode 122*b* simultaneously in each of the display regions 112*d*. Usually, metals such as magnesium (Mg), magnesium-silver alloy, aluminum (Al), lithium aluminum alloy and calcium (Ca) have been generally used to form the first electrode 122*a* and the second electrode 122*b*, but the disclosure is not limited thereto. In some embodiments, the light-emitting layer 124 includes an organic light-emitting layer. Accordingly, the light-emitting device 130 is an organic light-emitting device.

When a voltage is applied across the first electrode 122*a* and the second electrode 122*b*, electrons are injected from the cathode into the organic light-emitting layer 124 and holes are injected from the anode into the organic light-emitting layer 124. The holes and electrons recombine in the organic light-emitting layer 124, which emits light. To achieve efficient electroluminescence, some known organic light emitting devices include multiple layers. In some embodiments, a first carrier layer 126 is disposed over the first electrode 122*a* while a second carrier layer 128 is disposed over the second electrode 122*b*. And the first carrier layer 126 is spaced apart and electrically isolated from the second carrier layer 128. In some embodiments, the first electrode 122*a* contacts the first carrier layer 126, and the second electrode 122*b* contacts the second carrier layer 128. As shown in FIG. 2, the first carrier layer 126 is coupled to the light-emitting layer 124 and the first electrode 122*a*, and the second carrier layer 128 is coupled to the light-emitting layer 124 and the second electrode 122*b*. In some embodiments, the first electrode 122*a* is an anode and the second electrode 122*b* is a cathode. The first carrier layer 126 can include a hole-transporting layer (HTL) 126-1 and a hole-injecting layer (HIL) 126-2. The hole-transporting layer 126-1 and the hole-injecting layer 126-2 include organic materials, and thus the first carrier layer 126 is referred to as a first organic layer 126, but the disclosure is not limited thereto. The second carrier layer 128 can include an electron-transporting layer (ETL) 128-1 and an electron-injecting layer (EIL) 128-2. The electron-transporting layer 128-1 and the electron-injecting layer 128-2 include organic materials, and thus the second carrier layer 128 is referred to as a second organic layer 128, but the disclosure is not limited thereto.

Figure 3:
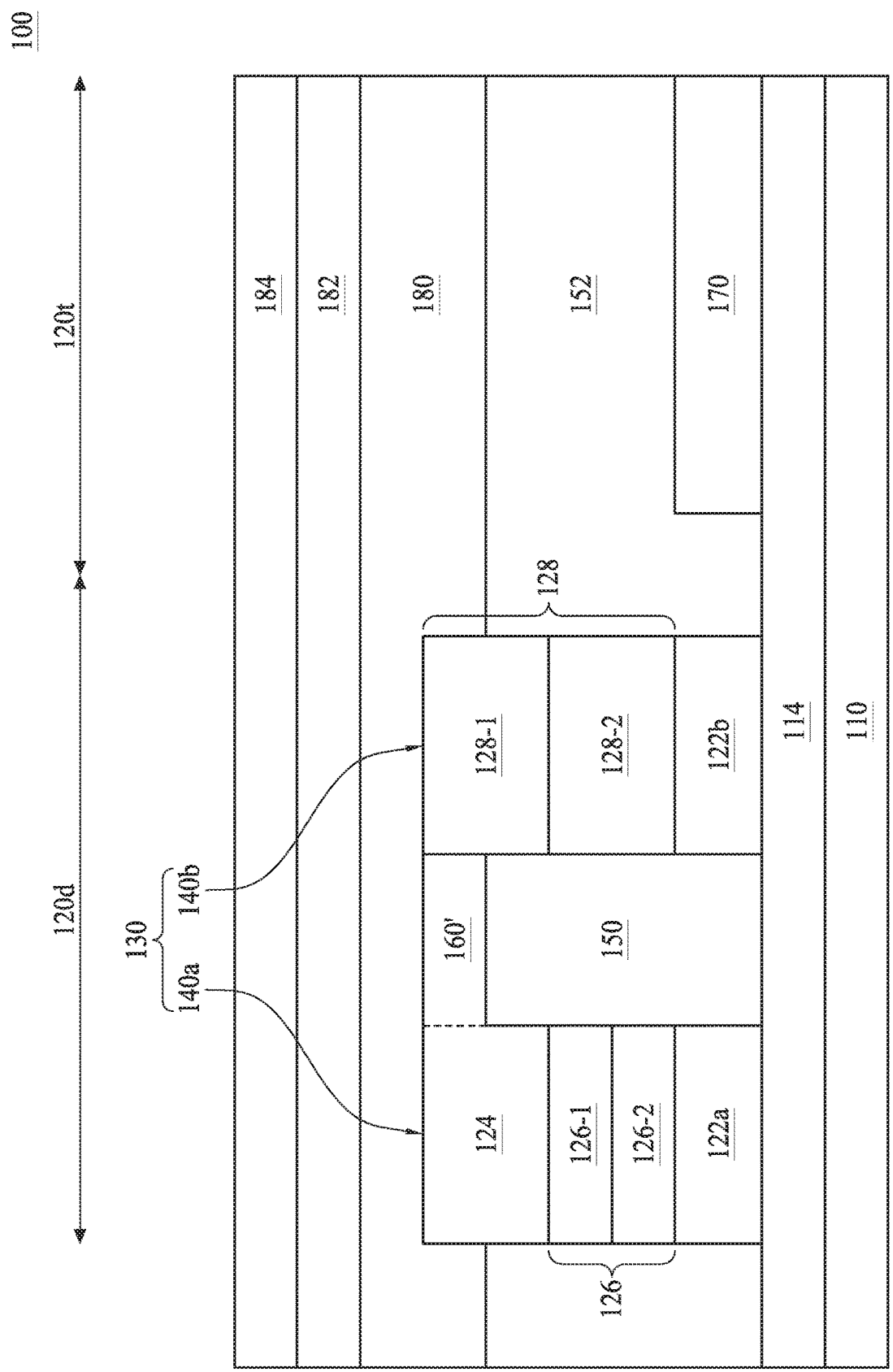
FIG. 3 is a schematic drawing illustrating a light-emitting device according to aspects of the present disclosure in some embodiments.

Still referring to FIG. 2, the light-emitting device 130 can be referred to include a first structure 140*a* and a second structure 140*b* spaced apart from each other. In some embodiments, a dielectric structure 150 can be disposed between the first structure 140*a* and the second structure 140*b*, but the disclosure is not limited thereto. The dielectric structure 150 spaces apart the first structure 140*a* from the second structure 140*b*, as shown in FIG. 2. The first structure 140*a* includes the first electrode 122*a*, the light-emitting layer 124 disposed over the first electrode 122*a*, and the first organic layer 126 sandwiched between the first electrode 122*a* and the light-emitting layer 124. The second structure 140*b* includes the second electrode 122*b* and the second organic layer 128 disposed over the second electrode 122*b*. More importantly, the light-emitting device 130 includes a connecting bridge 160 or 160' connecting the light-emitting layer 124 of the first structure 140*a* and the second organic layer 128 of the second structure 140*b*, as shown in FIG. 2. In some embodiments, the connecting bridge 160 or 160' is disposed over the dielectric structure 150 to connect the light-emitting layer 124 and the electron-transporting layer 128-1 of the second structure 140*b*. As shown in FIGS. 2 and 3, the connecting bridge 160 or 160' contacts a portion of the first structure 140*a* and a portion of the second structure 140*b*. For example but not limited to, the connecting bridge 160 or 160' contacts at least a portion of a sidewall of the light-emitting layer 124 and at least a portion of a sidewall of the second organic layer 128. In some embodiments, the connecting bridge 160 and the electron-transporting layer 128-1 include the same material, as shown in FIG. 2. Accordingly, electrons from the second electrode 122b pass the connecting bridge 160 and recombine with the hole from the first electrode 122a in the light-emitting layer 124, where lights are emitted. In some embodiments, the connecting bridge 160' and the light-emitting layer 124 include the same material, as shown in FIG. 3. Accordingly, electrons from the second electrode 122b recombine with the hole from the first electrode 122a in both of the connecting bridge 160' and the light-emitting layer 124, where lights are emitted.

Figure 4:
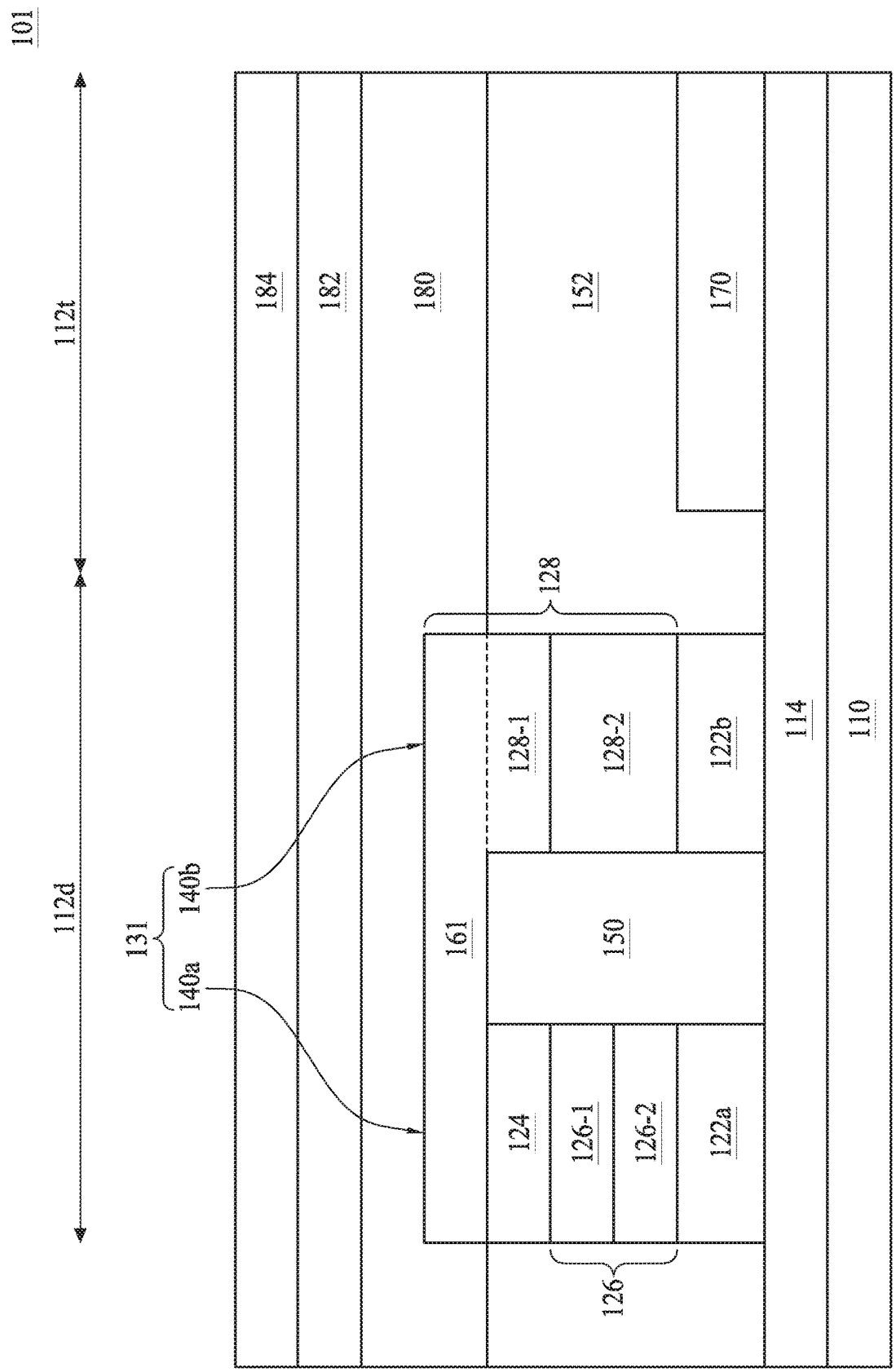
FIG. 4 is a schematic drawing illustrating a light-emitting device according to aspects of the present disclosure in some embodiments.

Referring to FIG. 4, which is a schematic drawing illustrating a light-emitting device and a portion of the display panel according to aspects of the present disclosure in some embodiments. In some embodiments, a display panel such as a touch display panel 101 is provided as shown in FIG. 4. Additionally, the touch display panel 101 shown in FIG. 4 can also be a cross-sectional view taken along line A-A' of FIG. 1. The touch display panel 101 can be similar to the touch display panel 100, and thus only the difference is detailed. Referring to FIG. 4, the display panel 101 includes a light-emitting device 131 disposed over the substrate 110 in each of the display regions 112d. The light-emitting device 131 includes a first electrode 122a, a second electrode 122b, and a light-emitting layer 124. In some embodiments, the light-emitting layer 124 is an organic light-emitting layer, but the disclosure is not limited to this. As mentioned above, both of the first electrode 122a and the second electrode 122b are disposed at the same side of the light-emitting layer 124. And first electrode 122a is electrically isolated from the second electrode 122b.

Figure 5:
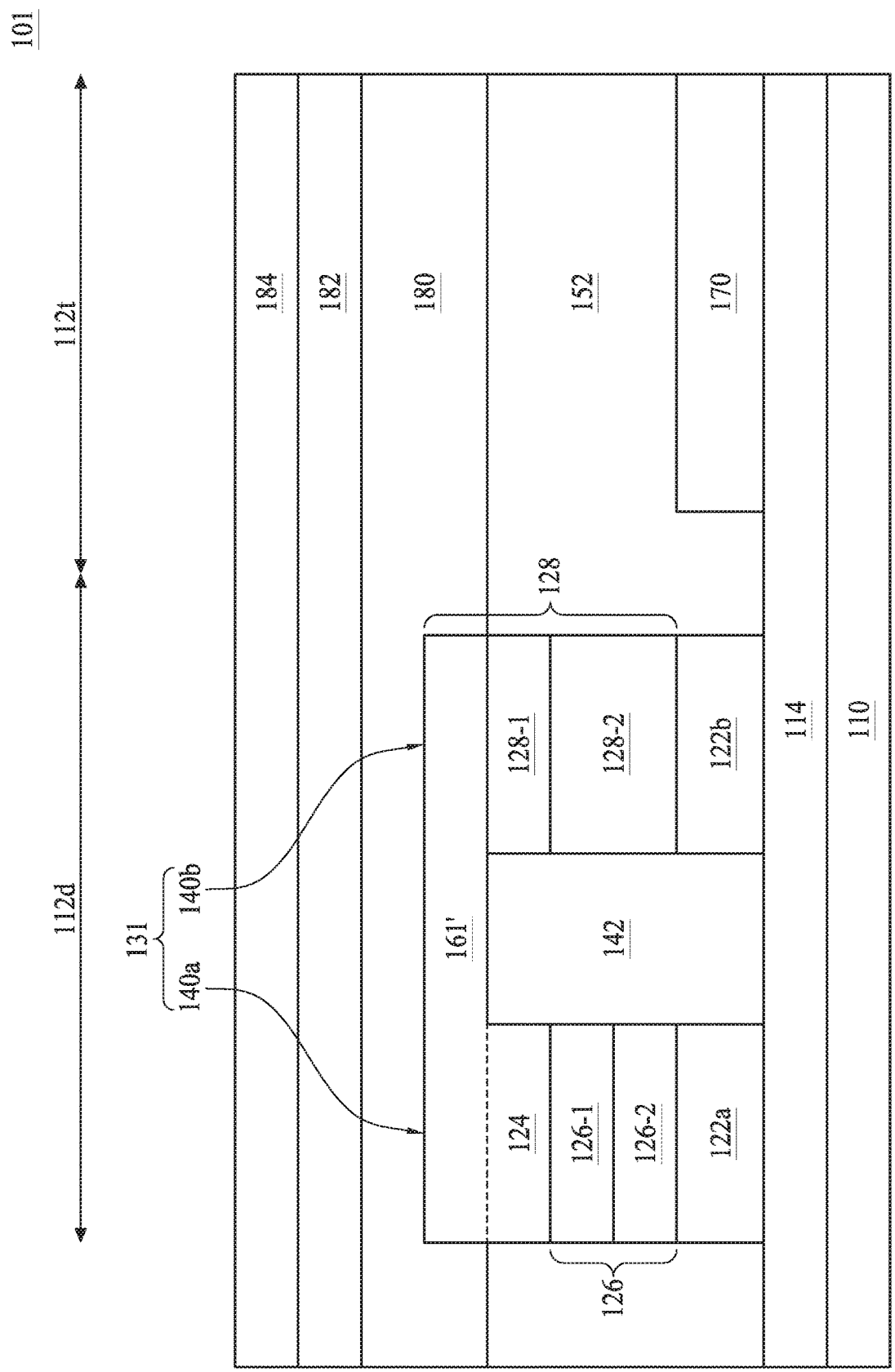
FIG. 5 is a schematic drawing illustrating a light-emitting device according to aspects of the present disclosure in some embodiments.

In some embodiments, a first carrier layer 126 is disposed over the first electrode 122a while a second carrier layer 128 is disposed over the second electrode 122b. The first carrier layer 126 contacts the first electrode 122a, and the second carrier layer 128 contacts the second electrode 122b. And the first carrier layer 126 is spaced apart from the second carrier layer 128. As shown in FIG. 4, the first carrier layer 126 is coupled to the light-emitting layer 124 and the first electrode 122a, and the second carrier layer 128 is coupled to the light-emitting layer 124 and the second electrode 122b. As shown in FIGS. 4 and 5, both of the first layer carrier 126 and the second carrier layer 128 are disposed at the same side of the light-emitting layer 124. Furthermore, the first carrier layer 126 and the second carrier layer 128 are disposed at the same side of the organic light-emitting layer 124 as the first electrode 122a and the second electrode 122b. In some embodiments, the first electrode 122a is an anode and the second electrode 122b is a cathode. The first carrier layer 126 can include a hole-transporting layer 126-1 and a hole-injecting layer 126-2. The hole-transporting layer 126-1 and the hole-injecting layer 126-2 include organic materials, and thus the first carrier layer 126 is referred to as a first organic layer 126, but the disclosure is not limited thereto. The second carrier layer 128 can include an electron-transporting layer 128-1 and an electron-injecting layer 128-2. The electron-transporting layer 128-1 and the electron-injecting layer 128-2 include organic materials, and thus the second carrier layer 128 is referred to as a second organic layer 128, but the disclosure is not limited thereto.

Still referring to FIG. 4, the light-emitting device 131 can be referred to include a first structure 140a and a second structure 140b spaced apart from each other. In some embodiments, a dielectric structure 150 can be disposed between the first structure 140a and the second structure 140b, but the disclosure is not limited thereto. The dielectric structure 150 spaces apart and electrically isolates the first structure 140a from the second structure 140b, as shown in FIG. 4. The first structure 140a includes the first electrode 122a, the light-emitting layer 124 disposed over the first electrode 122a, and the first organic layer 126 sandwiched between the first electrode 122a and the light-emitting layer 124. The second structure 140b includes the second electrode 122b and the second organic layer 128 disposed over the second electrode 122b. More importantly, the light-emitting device 131 includes a connecting bridge 161 or 161' connecting the light-emitting layer 124 of the first structure 140a and the second organic layer 128 of the second structure 140b, as shown in FIGS. 4 and 5. In some embodiments, the connecting bridge 161 or 161' is disposed over the first structure 140a, the dielectric structure 150 and the second structure 140b to connect the light-emitting layer 124 and the electron-transporting layer 128-1 of the second structure 140b. As shown in FIG. 4, the connecting bridge 161 or 161' contacts a portion of the first structure 140a and a portion of the second structure 140b. For example but not limited to, the connecting bridge 161 or 161' contacts at least a top surface of the light-emitting layer 124 and at least a top surface of the second organic layer 128. In some embodiments, the connecting bridge 161 and the electron-transporting layer 128-1 include the same material, as shown in FIG. 4. Accordingly, electrons from the second electrode 122b pass the connecting bridge 161 and recombine with the hole from the first electrode 122a in the light-emitting layer 124, where lights are emitted. In some embodiments, the connecting bridge 161' and the light-emitting layer 124 include the same material, as shown in FIG. 5. Accordingly, electrons from the second electrode 122b recombine with the hole from the first electrode 122a in both of the connecting bridge 161' and the light-emitting layer 124, where lights are emitted.

Figure 6:
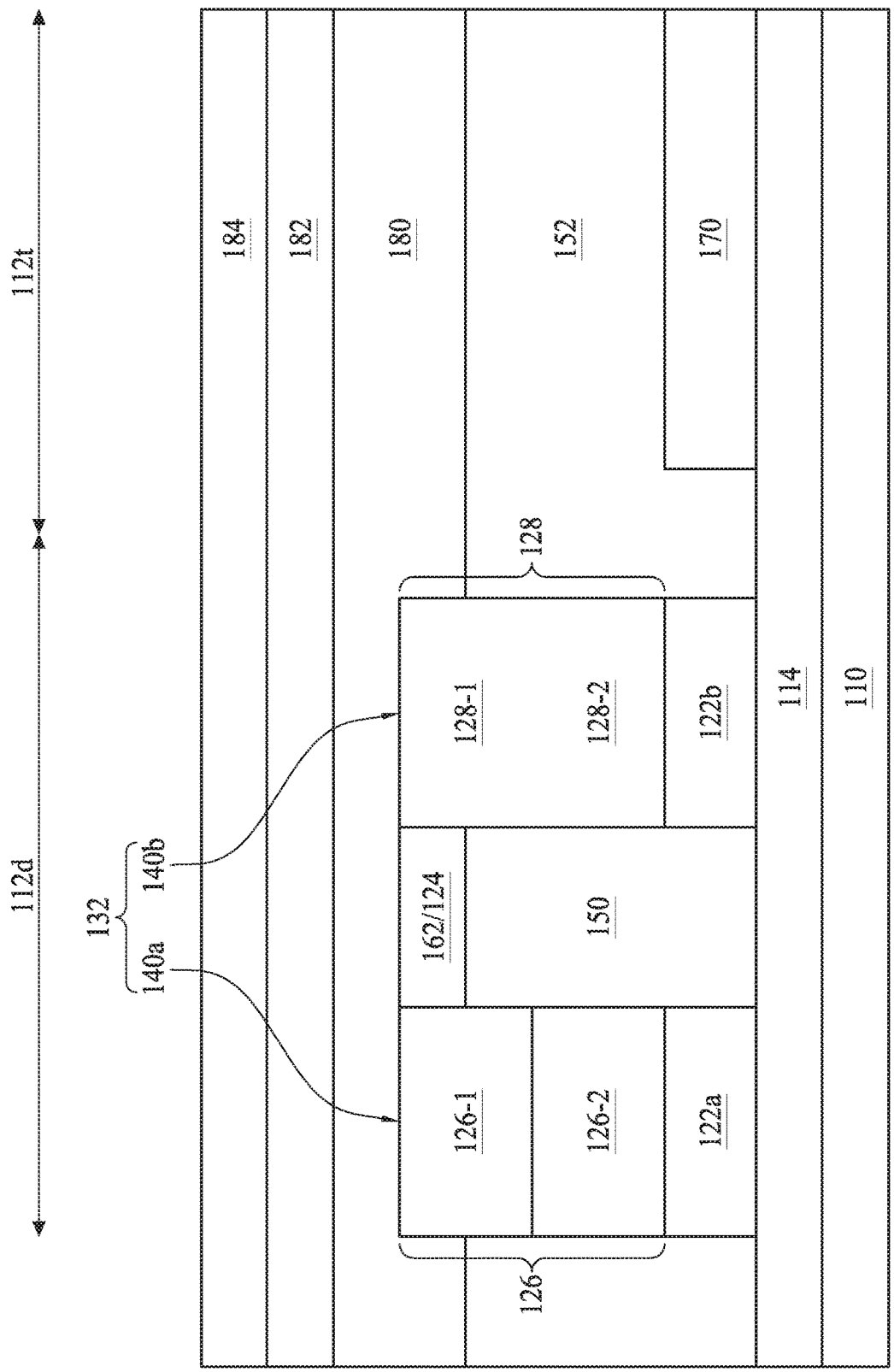
FIG. 6 is a schematic drawing illustrating a light-emitting device according to aspects of the present disclosure in some embodiments.

Referring to FIG. 6, which is a schematic drawing illustrating a light-emitting device and a portion of the display panel according to aspects of the present disclosure in some embodiments. In some embodiments, a display panel such as a touch display panel 102 is provided as shown in FIG. 6. Additionally, the display panel 102 shown in FIG. 6 can also be a cross-sectional view taken along line A-A' of FIG. 1. The display panel 102 can be similar to the touch display panel 100, and thus only the difference is detailed. Referring to FIG. 6, the touch display panel 102 includes a light-emitting device 132 disposed over the substrate 110 in each of the display regions 112d. The light-emitting device 132 includes a first electrode 122a, a second electrode 122b, and a light-emitting layer 124. In some embodiment, the light-emitting layer 124 is an organic light-emitting layer. As mentioned above, both of the first electrode 122a and the second electrode 122b are disposed at the same side of the light-emitting layer 124. And first electrode 122a is electrically isolated from the second electrode 122b.

In some embodiments, a first carrier layer 126 is disposed over the first electrode 122a while a second carrier layer 128 is disposed over the second electrode 122b. The first carrier layer 126 contacts the first electrode 122a and the second carrier layer 128 contacts the second electrode 122b. And the first carrier layer 126 is spaced apart and electrically isolated from the second carrier layer 128. As shown in FIG. 6, the first carrier layer 126 is coupled to the first electrode 122a, and the second carrier layer 128 is coupled to the second electrode 122b. In some embodiments, the first electrode 122a is an anode and the second electrode 122b is a cathode. The first carrier layer 126 can include a hole-transporting layer 126-1 and a hole-injecting layer 126-2. The hole-transporting layer 126-1 and the hole-injecting layer 126-2 include organic materials, and thus the first carrier layer 126 is referred to as a first organic layer 126, but the disclosure is not limited thereto. The second carrier layer 128 can include an electron-transporting layer 128-1 and an electron-injecting layer 128-2. The electron-transporting layer 128-1 and the electron-injecting layer 128-2 include organic materials, and thus the second carrier layer 128 is referred to as a second organic layer 128, but the disclosure is not limited thereto. Accordingly, the holes from the first electrode 122*a* and the electrons from the second electrode 122*b* recombine in the organic light-emitting layer 124, which is the connecting bridge 162, where lights are emitted from.

Still referring to FIG. 6, the light-emitting device 132 can be referred to include a first structure 140*a* and a second structure 140*b* spaced apart from each other. In some embodiments, a dielectric structure 150 can be disposed between the first structure 140*a* and the second structure 140*b*, but the disclosure is not limited thereto. The dielectric structure 150 spaces apart and electrically isolated the first structure 140*a* from the second structure 140*b*, as shown in FIG. 4. The first structure 140*a* includes the first electrode 122*a* and the first organic layer 126 disposed over the first electrode 122*a*, and the second structure 140*b* includes the second electrode 122*b* and the second organic layer 128 disposed over the second electrode 122*b*. More importantly, the light-emitting device 132 includes a connecting bridge 162 connecting the first structure 140*a* and the second structure 140*b*, as shown in FIG. 6. In some embodiments, the connecting bridge 162 is disposed over the dielectric structure 150. As shown in FIG. 6, the connecting bridge 162 contacts a portion of the first structure 140*a* and a portion of the second structure 140*b*. For example but not limited to, the connecting bridge 162 contacts at least a portion of sidewall of the first organic layer 126 and at least a portion of sidewall of the second organic layer 128. In some embodiments, the connecting bridge 162 is the light-emitting layer 124.

Referring to FIGS. 1-6, the touch display panels 100, 101 and 102 can further include at least one touch sensor 170 disposed over the substrate 110 in the touch sensing region 112*t*. As mentioned above, the touch sensing regions 112*t* can surround the display region 112*d* in some embodiments. Therefore, one or more touch sensors 170 can be disposed in the touch sensing regions 112*t* if required. In some embodiments, each sub-pixel includes one light-emitting device 130, 131 or 132 and one touch sensor 170. In some embodiments, each sub-pixel includes one light-emitting device 130, 131 or 132 and a portion of one touch sensor 170. In still some embodiments, each sub-pixel includes one light-emitting device 130, 131 or 132 and a plurality of touch sensors 170. It should be understood that the types and amounts of the touch sensor 170 can be modified according to different product requirements. In some embodiments, the touch sensor 170, the first electrode 122*a* of the light-emitting device 130, and the second electrode 122*b* of the light-emitting device 130 include the same material. In some embodiments, the touch sensor 170, the first electrode 122*a*, and the second electrode 122*b* are made of the same conductive layer. For example but not limited to, a conductive layer is disposed over the substrate 110 and followed by patterning the conductive layer to form the touch sensor 170, the first electrode 122*a* and the second electrode 122*b* in some embodiments.

Referring to FIGS. 2-6 again, the touch display panel 100, 101 and 102 further includes a dielectric structure 152 disposed over the substrate 110 and the touch sensor 170. At least a portion of the dielectric structure 152 is disposed between the touch sensor 170 and the light-emitting device 130, 131 or 132 along the substrate-horizontal direction. Accordingly, the touch sensor 170 is electrically isolated from the light-emitting device 130, 131 or 132 by the portion of the dielectric structure 152. Accordingly, the display panels 100, 101 and 102 are provided as an in-cell touch display panel.

Still referring to FIGS. 2-6, the touch display panels 100, 101 and 102 can further include a thin film encapsulation (TFE) layer 180 disposed over the substrate 112. In some embodiments, the film encapsulation layer 180 is provided to encapsulate the light-emitting device 130, 131 or 132, the touch sensor 170 and the dielectric structure 152, and thus to protect those elements and to provide a planar surface. Additionally, the touch display panels 100, 101 and 102 selectively includes a polarizer 184 adhered to the thin film encapsulation layer 180 by an optical clear adhesive (OCA) 182.

Figure 7:
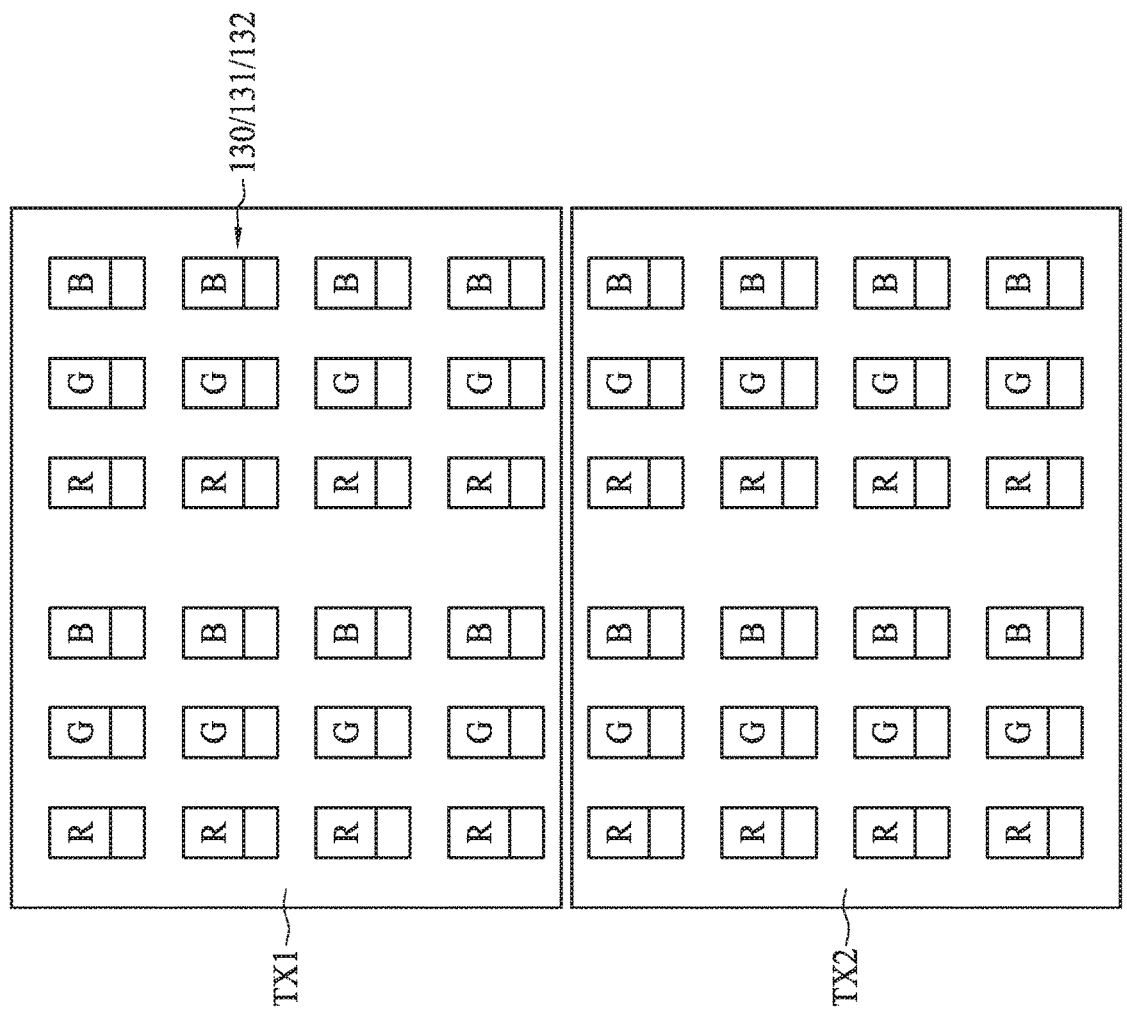
FIG. 7 is a plan view of a touch display panel according to aspects of the present disclosure in some embodiments.

As mentioned above, one or more touch sensors 170 can be disposed in the touch sensing regions 112*t*. Referring to FIG. 7, which is a plan view of a touch display panel according to aspects of the present disclosure in some embodiments, the touch sensors 170 include transmitter electrodes TX1, TX2 . . . TXn in some embodiments. Accordingly, the touch sensors 170 are self-capacitance type touch sensors. When a finger touches the self-capacitance type touch sensor, capacitance change occurs. And a sensing circuit is able to sense a touch position and a touch area by measuring a change in capacitance (or electric charge) caused by an object contacting the self-capacitance type touch sensor to which a touch driving signal is applied.

Referring to FIG. 8, which is a plan view of a touch display panel according to aspects of the present disclosure in some embodiments, the touch sensors 170 include transmitter electrodes TX and receive electrodes RX in some embodiments. Accordingly, the touch sensors 170 are mutual-capacitance type touch sensor uses mutual capacitance that occurs between the TX electrodes to which the touch driving signal is applied and the RX electrodes crossing the TX lines with a dielectric layer (or insulation layer) interposed between them. And a sensing circuit is able to sense a touch position and a touch area by receiving a change in the capacitance (or electric charge) of the touch sensor caused by an object contacting the touch sensor.

In the present disclosure, a polarizer is not necessary because the first electrode and the second electrode are disposed at the same side of the light-emitting layer. Therefore, light emission efficiency is improved and the display panel can be slimmer. Furthermore, since the touch sensing region and the display region are defined along the substrate-horizontal direction and are not overlapped each other, the light-emitting device disposed in the display region and the touch sensor disposed in the touch sensing region are not overlapped. Consequently, a slimmer touch display panel is provided by the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A light-emitting device, comprising:
an organic light-emitting layer;
an anode disposed at one side of the organic light-emitting layer;
a first carrier layer, coupled to the organic light-emitting layer and the anode;
a cathode disposed at the same side of the organic light-emitting layer as the anode; and
a second carrier layer, coupled to the organic light-emitting layer and the cathode,
wherein the anode is spaced apart from the cathode, and the anode and the cathode are disposed on and in contact with a thin film transistor (TFT) array layer, and bottom surfaces of the anode and the cathode are coplanar with a top surface of the TFT array layer, and
wherein at least one of lateral sidewalls of the first carrier layer and the second carrier layer is in contact with the organic light-emitting layer from a cross section of the light-emitting device.

2. The light-emitting device of claim 1, wherein the first carrier layer is spaced apart from the second carrier layer.

3. The light-emitting device of claim 1, wherein the first carrier layer and the second carrier layer are disposed at the same side of the organic light-emitting layer as the anode and the cathode.

4. The light-emitting device of claim 1, wherein the first carrier layer comprises a hole-transporting layer (HTL) and a hole-injecting layer (HIL), and the second carrier layer comprises an electron-transporting layer (ETL) and an electron-injecting layer (EIL).

5. A light-emitting device, comprising:
a first structure comprising:
an anode;
a light-emitting layer disposed over the anode; and
a first organic layer sandwiched between the anode and the light-emitting layer;
a second structure spaced apart from the first structure, the second structure comprising:
a cathode; and
a second organic layer disposed over the cathode, wherein a thickness of the first organic layer is different from a thickness of the second organic layer; and
a connecting bridge connecting the light-emitting layer of the first structure and the second organic layer of the second structure; and
an TFT array layer, wherein the first structure and the second structure are disposed on and in contact with the TFT array layer, and bottom surfaces of the anode and the cathode are coplanar with a top surface of the TFT array layer.

6. The light-emitting device of claim 5, wherein the first organic layer comprises a hole-transporting layer (HTL) and a hole-injecting layer (HIL), and the second organic layer comprises an electron-transporting layer (ETL) and an electron-injecting layer (EIL).

7. The light-emitting device of claim 6, wherein the connecting bridge and the electron-transporting layer comprise a same material.

8. The light-emitting device of claim 5, wherein the connecting bridge and the light-emitting layer comprise a same material.

9. The light-emitting device of claim 5, wherein the connecting bridge contacts at least a portion of the second organic layer and at least a portion of the light-emitting layer.

10. The light-emitting device of claim 5, further comprising a dielectric structure spaces the first structure apart from the second structure.

11. A display panel, comprising:
a substrate comprising a plurality of display regions and a touch sensing region defined along a substrate-horizontal direction, wherein the plurality of display regions and the touch sensing region are not overlapped;
a plurality of light-emitting devices disposed over the substrate in the plurality of display regions, each of the plurality of light-emitting devices comprising:
an anode and a cathode having a polarity opposite to a polarity of the anode;
an organic light-emitting layer;
a first carrier layer, coupled to the organic light-emitting layer and the anode; and
a second carrier layer, coupled to the organic light-emitting layer and the cathode,
wherein at least one of lateral sidewalls of the first carrier layer and the second carrier layer is in contact with the organic light-emitting layer from a cross section; and
at least one touch sensor disposed over the substrate in the touch sensing region, wherein the touch sensing region surrounds each light-emitting device, and bottom surfaces of the touch sensor, the anode and the cathode are coplanar.

12. The display panel of claim 11, wherein
the anode is disposed at one side of the organic light-emitting layer,
the cathode is disposed at the same side of the organic light-emitting layer as the anode, and
the anode is spaced apart from the cathode.

13. The display panel of claim 11, wherein the anode, the cathode and the touch sensor comprise a same material.

14. The display panel of claim 13, wherein the anode, the cathode and the touch sensor are made of a same conductive layer.

15. The display panel of claim 11, wherein the first carrier layer is spaced apart from the second carrier layer.

16. The display panel of claim 11, wherein the first carrier layer and the second carrier layer are disposed at the same side of the organic light-emitting layer as the anode and the cathode.

17. The display panel of claim 11, wherein the first carrier layer comprises a hole-transporting layer (HTL) and a hole-injecting layer (HIL), and the second carrier layer comprises an electron-transporting layer (ETL) and an electron-injecting layer (EIL).

18. The display panel of claim 11, wherein the touch sensing region surrounds each display region.

19. The display panel of claim 11, further comprising a dielectric structure disposed over the substrate and the touch sensor, at least a portion of the dielectric structure is disposed between the touch sensor and each light-emitting device along the substrate-horizontal direction, and the touch sensor is electrically isolated from the plurality of light-emitting devices by the portion of the dielectric structure.

20. The display panel of claim 11, further comprising an array layer disposed over the substrate.

* * * * *